United States Patent
Komatsu et al.

[11] Patent Number: 6,094,235
[45] Date of Patent: Jul. 25, 2000

[54] DIGITAL TELEVISION BROADCAST RECEIVER THAT DEMODULATES AN INTERMEDIATE FREQUENCY SIGNAL HAVING A FREQUENCY HIGHER THAN A FREQUENCY OF A RECEIVED SIGNAL

[75] Inventors: Michihiro Komatsu; Akira Takayama, both of Soma, Japan

[73] Assignee: Alps Electric Co., Ltd., Tokyo, Japan

[21] Appl. No.: 09/052,465

[22] Filed: Mar. 31, 1998

[30]   Foreign Application Priority Data

Apr. 25, 1997 [JP] Japan .................................. 9-109848

[51] Int. Cl.[7] .............................. H04N 5/44; H04N 5/455
[52] U.S. Cl. ......................... 348/725; 348/726; 348/641
[58] Field of Search .................................. 348/725, 726, 348/638, 639, 641, 508; 375/316, 320, 324; H04N 5/44, 5/455, 9/66

[56]   References Cited

U.S. PATENT DOCUMENTS

| | | | |
|---|---|---|---|
| 5,841,814 | 11/1998 | Cupo | 375/321 |
| 5,933,200 | 8/1999 | Han | 348/725 |
| 5,956,098 | 9/1999 | Mizukami | 348/732 |

FOREIGN PATENT DOCUMENTS 09064772   3/1997   Japan .

*Primary Examiner*—Sherrie Hsia
*Attorney, Agent, or Firm*—Brinks Hofer Gilson & Lione

[57] ABSTRACT

A digital television broadcast receiver comprising a digital signal demodulator, wherein the frequency of an intermediate frequency signal is made higher than the maximum frequency of any received signal, the intermediate frequency signal being demodulated by the digital signal demodulator, whereby interference attributable to a carrier signal from an oscillator of the demodulator is suppressed during demodulation.

3 Claims, 1 Drawing Sheet

DIGITAL TELEVISION BROADCAST RECEIVER THAT DEMODULATES AN INTERMEDIATE FREQUENCY SIGNAL HAVING A FREQUENCY HIGHER THAN A FREQUENCY OF A RECEIVED SIGNAL

BACKGROUND OF THE INVENTION

1. Field of the Invention

The present invention relates to a digital television broadcast receiver for receiving so-called digital CS (communications satellite) television broadcasts as well as CATV (community antenna television) transmissions.

2. Description of the Related Art

Conventional digital broadcast receivers utilize in part an analog tuner 11, shown in FIG. 2, for conventional analog television broadcast reception. The analog tuner 11 comprises an input tuning circuit 12, a mixing circuit 13, a local oscillator 14 and an output filter 15. The input tuning circuit 12 is constituted by a single tuning circuit capable of tuning in to the frequency of a received signal representing each channel desired to be received. The tuning frequency is variable so that channels of low through high frequencies may be selected as desired (between about 50 MHz and 900 MHz according to US specifications). The received signal selected by the input tuning circuit 12 is input to the mixing circuit 13 with virtually no attenuation.

The received signal input to the mixing circuit 13 is mixed thereby with a locally oscillated signal from the local oscillator 14 so as to be converted in frequency to an intermediate frequency signal. For conventional analog television systems, intermediate frequency signals are standardized in terms of frequency. Illustratively, in the United States, the video intermediate frequency is fixed at 45.75 MHz and the audio intermediate frequency at 41.25 MHz. As a result, the frequencies of locally oscillated signals from the local oscillator 14 are also determined uniquely; the frequency of any locally oscillated signal is always made higher than that of any received signal by the frequency of the intermediate frequency signal involved. Where the frequency band of received signals ranges from 50 MHz to 900 MHz, the frequency of the locally oscillated signal varies within a range of about 95 MHz through 945 MHz, a 10-fold rate of change.

The intermediate frequency signal from the mixing circuit 13 is forwarded through the output filter 15 and output from the analog tuner 11. The output filter 15 is composed of a band-pass filter having a pass band of about 6 MHz and designed to filter out signals of adjacent channels.

The analog tuner 11 is connected to an orthogonal demodulator 16, a type of digital signal demodulator. An oscillator 17 in the orthogonal demodulator 16 generates a carrier signal (about 44 MHz) to demodulate the intermediate frequency signal, whereby base band signals such as the I signal and Q signal are obtained.

Because conventional digital television broadcast receivers use the traditional analog tuner, the frequency of the carrier signal generated by the oscillator 17 upon demodulation is relatively low (typically tens of MHz) so that harmonics from the oscillator 17 can enter the frequency band of the received signal. For example, the fourth harmonic of the carrier signal is about 176 MHz, which happens to fall within the frequency band of the television signal on channel 7 in the United States. The harmonic, entering the analog tuner 11 and again output from the input tuning circuit 12, interferes with the normal television signal on channel 7.

SUMMARY OF THE INVENTION

It is therefore an object of the present invention to provide a digital television broadcast receiver capable of averting reception interference attributable to a carrier signal generated by an oscillator of a digital signal demodulator at the time of demodulation.

In carrying out the invention and according to one aspect thereof, there is provided a digital television broadcast receiver comprising a digital signal demodulator, wherein the frequency of an intermediate frequency signal is made higher than the maximum frequency of any received signal, the intermediate frequency signal being demodulated by the digital signal demodulator.

In a preferred structure according to the invention, the digital television broadcast receiver may further comprise a mixing circuit for admitting the received signal and a local oscillator for inputting a locally oscillated signal to the mixing circuit, wherein the frequency of the locally oscillated signal is made higher than that of the received signal, and wherein the frequency of the intermediate frequency signal is made equal to the difference between the frequency of the locally oscillated signal and that of the received signal.

In another preferred structure according to the invention, the frequency of the intermediate frequency signal may fall between 1100 MHz and 1400 MHz.

Other objects, features and advantages of the invention will become more apparent upon a reading of the following description and appended drawings.

DESCRIPTION OF THE PREFERRED EMBODIMENT

Figure 1:
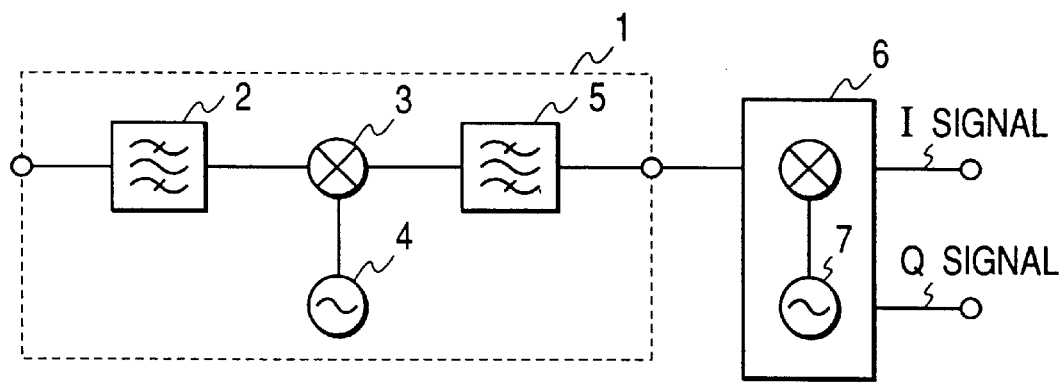
FIG. 1 is a schematic view partially illustrating a digital television broadcast receiver embodying the invention.
Figure 2:
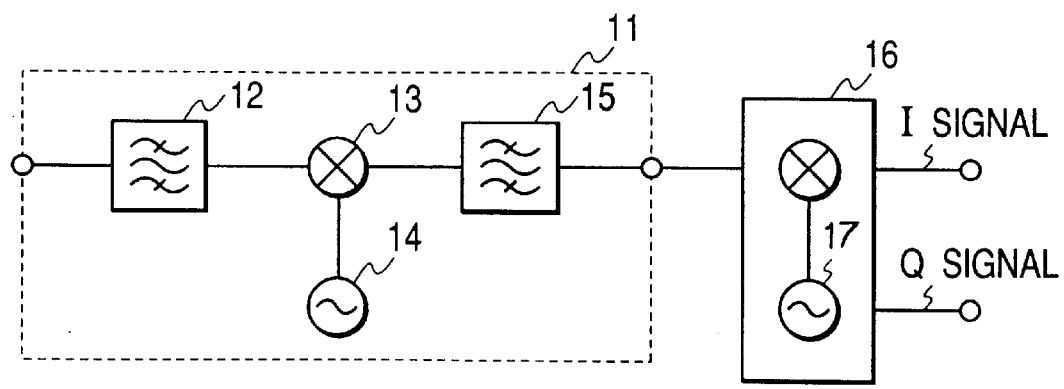
FIG. 2 is a schematic view partially depicting a conventional digital television broadcast receiver.

A digital television broadcast receiver as a preferred embodiment of the invention will now be described with reference to FIG. 1. In FIG. 1, reference numeral 1 represents a digital tuner for use by the inventive digital television broadcast receiver. The digital tuner 1 comprises a band-pass filter 2, a mixing circuit 3, a local oscillator 4 and an output filter 5. The band-pass filter 2 passes all digital television signals (called the received signal(s) hereunder) ranging from about 50 MHz to 900 MHz in frequency. The band-pass filter 2 allows the received signal of any channel to enter the mixing circuit 3 with virtually no attenuation.

The received signal input to the mixing circuit 3 is mixed thereby with a locally oscillated signal from the local oscillator 4 so as to be converted in frequency to an intermediate frequency signal. The frequency of the intermediate frequency signal is set illustratively for 1200 MHz, i.e., a frequency higher than the maximum frequency (900 MHz) of received signals. In addition, the frequency of the intermediate frequency signal is set to be the same as the difference between the frequency of the locally oscillated signal and that of the received signal. For example, where the signal of channel 2, i.e., the lowest-frequency channel in the United States (video carrier frequency: 55.25 MHz) is received, the frequency of the locally oscillated signal from the local oscillator 4 is 1255.25 MHz. The frequency of the locally oscillated signal is made to change in accordance with the frequency of the received signal. The changes of frequency range from 1255.25 MHz to 2085.25 MHz, representing less than a two-fold rate of change.

The intermediate frequency signal at 1200 MHz from the mixing circuit 3 is forwarded through the output filter 5 and output from the digital tuner 1. The output filter 5 is constituted illustratively by a band-pass filter such as a dielectric filter having a pass band of about 6 MHz. As such, the output filter 5 filters out signals of adjacent channels.

The digital tuner 1 is connected to an orthogonal demodulator 6, a type of digital signal demodulator. An oscillator 7 in the orthogonal demodulator 6 generates a carrier signal (having a frequency of about 1200 MHz) to demodulate the intermediate frequency signal, whereby base band signals such as the I signal and Q signal are acquired.

As described, the digital television broadcast receiver according to the invention has the frequency of the intermediate frequency signal set to be higher than the maximum frequency of any received signal, whereby the intermediate frequency signal is demodulated. This means that the carrier signal generated by the oscillator of the digital signal demodulator upon demodulation is also higher than the maximum frequency of the received signals. Because the fundamental harmonic of the carrier signal and the higher harmonics associated therewith fall outside the band of the received signals, there is no possibility of these harmonics being again input to the digital tuner 1 to interfere with any received signal. It follows that installation of the band-pass filter 2 is not mandatory. Without the band-pass filter 2, the structure of the digital tuner 1 may be further simplified than before.

With the digital television broadcast receiver of the invention, the frequency of the locally oscillated signal from the local oscillator 4 in the digital tuner 1 is higher than the frequency of any received signal, and the frequency of the intermediate frequency signal is made equal to the difference in frequency between the locally oscillated signal and the received signal. This setup causes frequencies of image signals resulting from any received signal to deviate to very high frequency levels outside the band of the received signal in question. It follows that a simply structured band-pass filter 2 in the digital tuner 1 still inhibits image signals effectively. With such an enhanced capability of image signal suppression, the inventive digital television broadcast receiver provides further reductions in image signal interference than its conventional counterpart using the traditional analog tuner 11.

Even where the locally oscillated signal sent from the local oscillator 4 past the mixing circuit 3 and band-pass filter 2 is radiated from an antenna or placed onto a cable, neither shown, there is little adverse effect on other receivers. That is because the frequency of the locally oscillated signal from the local oscillator 4 is brought outside the frequency band of the received signal. With the locally oscillated signal frequency outside the frequency band of the received signal, a simply structured band-pass filter 2 still minimizes the leakage level of the locally oscillated signal, whereby interference with other receivers is substantially eliminated.

Because the frequency of the intermediate frequency signal is set between 1100 MHz and 1400 MHz, the maximum frequency of the locally oscillated signal is held down to about 2200 MHz while the range of changes of the locally oscillated signal is narrowed. Where the output filter 5 for outputting the intermediate frequency signal is composed of a dielectric filter or a microstrip line filter, the filter will provide steep characteristics for filtering out signals of adjacent channels.

As described, the digital television broadcast receiver according to the invention comprises a digital signal demodulator, wherein the frequency of an intermediate frequency signal is made higher than that of any received signal, the intermediate frequency signal being demodulated by the digital signal demodulator. With this structure, the frequency of the carrier signal generated by the digital signal demodulator upon demodulation becomes higher than the frequency of the received signal. As a result, the fundamental harmonic from the oscillator generating the carrier signal and the higher harmonics associated therewith fall outside the band of the received signal, and there is no possibility of these harmonics being again input to the digital tuner 1 to interfere with the received signal on any channel. This means that the presence of the band-pass filter 2 is not mandatory and, without it, the structure of the digital tuner 1 is made simpler than before.

Preferably, the inventive digital television broadcast receiver may further comprise a mixing circuit for admitting the received signal and a local oscillator for inputting a locally oscillated signal to the mixing circuit, wherein the frequency of the locally oscillated signal is made higher than that of the received signal, and wherein the frequency of the intermediate frequency signal is made equal to the difference between the frequency of the locally oscillated signal and that of the received signal. With this structure, frequencies of image signals stemming from any received signal are brought to very high frequency levels outside the band of the received signal in question. Thus a simply structured band-pass filter in the digital tuner still inhibits image signals effectively. With the improved capability of image signal suppression, the inventive digital television broadcast receiver affords further reductions in image signal interference than its conventional counterpart using the traditional analog tuner.

Furthermore, even where the locally oscillated signal sent from the local oscillator past the mixing circuit and band-pass filter is radiated from an antenna or placed onto a cable, neither shown, there is little adverse effect on other receivers. That is because the frequency of the locally oscillated signal from the local oscillator is brought outside the frequency band of the received signal. With the locally oscillated signal frequency outside the frequency band of the received signal, a simply structured band-pass filter still minimizes the leakage level of the locally oscillated signal, whereby interference with other receivers is substantially eliminated.

In addition, because the frequency of the intermediate frequency signal is set between 1100 MHz and 1400 MHz for the inventive digital television broadcast receiver, the maximum frequency of the locally oscillated signal is held down to about 2200 MHz while the range of changes of the locally oscillated signal is narrowed. If the output filter 5 for outputting the intermediate frequency signal is composed of a dielectric filter or a microstrip line filter, the filter will provide steep characteristics for filtering out signals of adjacent channels.

As another advantage, the frequency of the intermediate frequency signal is set for 1400 MHz at the highest. This makes it easy to implement a digital signal demodulator for digitally demodulating the intermediate frequency signal.

As many apparently different embodiments of this invention may be made without departing from the spirit and scope thereof, it is to be understood that the invention is not limited to the specific embodiments thereof except as defined in the appended claims.

What is claimed is:

1. A digital television broadcast receiver comprising a digital signal demodulator, wherein a frequency of an intermediate frequency signal is made higher than a maximum frequency of a received signal received by the digital television broadcast receiver, said intermediate frequency signal being demodulated by said digital signal demodulator.

2. A digital television broadcast receiver according to claim 1, further comprising a mixing circuit for admitting said received signal and a local oscillator for inputting a locally oscillated signal to said mixing circuit, wherein a frequency of said locally oscillated signal is made higher than a frequency of said received signal, and wherein the frequency of said intermediate frequency signal is made equal to a difference between the frequency of said locally oscillated signal and the frequency of said received signal.

3. A digital television broadcast receiver according to claim 1, wherein the frequency of said intermediate frequency signal is made between 1100 MHz and 1400 MHz.

* * * * *